and at least one beam deflector 39 having at least one first deflec-

(12) United States Patent
Biberger et al.

(10) Patent No.: US 8,921,805 B2
(45) Date of Patent: Dec. 30, 2014

(54) ION BEAM SYSTEM AND METHOD OF OPERATING AN ION BEAM SYSTEM

(71) Applicant: Carl Zeiss Microscopy GmbH, Jena (DE)

(72) Inventors: Josef Biberger, Wildenberg (DE); Ralph Pulwey, Aalen (DE); Andreas Adolf, Aalen (DE)

(73) Assignee: Carl Zeiss Microscopy GmbH (DE)

( * ) Notice: Subject to any disclaimer, the term of this patent is extended or adjusted under 35 U.S.C. 154(b) by 0 days.

(21) Appl. No.: 14/218,563

(22) Filed: Mar. 18, 2014

(65) Prior Publication Data

US 2014/0197328 A1 Jul. 17, 2014

Related U.S. Application Data

(63) Continuation-in-part of application No. 13/251,174, filed on Sep. 30, 2011, now Pat. No. 8,710,451.

(60) Provisional application No. 61/404,433, filed on Oct. 1, 2010.

(30) Foreign Application Priority Data

Oct. 1, 2010 (DE) .......................... 10 2010 047 331

(51) Int. Cl.
| | |
|---|---|
| *H01J 3/14* | (2006.01) |
| *H01J 3/26* | (2006.01) |
| *H01J 37/147* | (2006.01) |
| *H01J 37/28* | (2006.01) |
| *H01J 37/317* | (2006.01) |

(52) U.S. Cl.
CPC ............... *H01J 3/26* (2013.01); *H01J 37/1477* (2013.01); *H01J 37/28* (2013.01); *H01J 37/317* (2013.01); *H01J 3/14* (2013.01); *H01J 2237/303* (2013.01); *H01J 2237/31749* (2013.01)
USPC ....................................... 250/396 R; 250/309

(58) Field of Classification Search
USPC .............................................. 250/396 R, 309
See application file for complete search history.

(56) References Cited

U.S. PATENT DOCUMENTS

| | | | |
|---|---|---|---|
| 4,342,949 | A | 8/1982 | Harte et al. |
| 4,752,721 | A | 6/1988 | Nishida et al. |

(Continued)

FOREIGN PATENT DOCUMENTS

| | | |
|---|---|---|
| EP | 1 389 797 A2 | 2/2004 |
| JP | 08-241689 A | 9/1996 |

(Continued)

OTHER PUBLICATIONS

E. Weidlich, "Design of a Non-Equisectored 20-Electrode Deflector for E-Beam Lithography Using a Field Emission Electron Beam", Microelectronic Engineering, vol. 11, 1990, pp. 347-350.

(Continued)

*Primary Examiner* — Kiet T Nguyen
(74) *Attorney, Agent, or Firm* — Alston & Bird LLP

(57) ABSTRACT

An ion beam system comprises a voltage supply system 7 and at least one beam deflector 39 having at least one first deflection electrode 51a, 51b, 51c and plural second deflection electrodes 52a, 52b, 52c, wherein the voltage supply system is configured to supply different adjustable deflection voltages to the plural second deflection electrodes such that electric deflection fields between the plural second deflection electrodes and the opposite at least one first deflection electrode have a common orientation. The system has a high kinetic energy mode in which a distribution of the electric deflection field has a greater width, a low kinetic energy mode in which a distribution of the electric deflection field has a smaller width.

16 Claims, 8 Drawing Sheets

(56) References Cited

U.S. PATENT DOCUMENTS

| | | | |
|---|---|---|---|
| 4,963,748 A | 10/1990 | Szilagyi | |
| 5,160,846 A | 11/1992 | Ray | |
| 6,521,895 B1 | 2/2003 | Walther et al. | |
| 7,755,068 B2 * | 7/2010 | Ma et al. | 250/492.3 |
| 2006/0255284 A1 | 11/2006 | Hill et al. | |
| 2006/0255288 A1 | 11/2006 | Petrov et al. | |
| 2007/0114455 A1 | 5/2007 | Naito et al. | |
| 2009/0289196 A1 | 11/2009 | Hill et al. | |

FOREIGN PATENT DOCUMENTS

| | | | |
|---|---|---|---|
| JP | 2000-133183 A | 5/2000 | |
| JP | 2002-117796 A | 4/2002 | |
| WO | 01/31679 A1 | 5/2001 | |

OTHER PUBLICATIONS

W. D. Meisburger et al., "Requirements and performance of an electron-beam column designed for x-ray mask inspection", J. Vac. Sci. Technol. B, vol. 9 (6), 1991, pp. 3010-3014.

E. Goto et al., "In-lens deflection system with nonequisectored-type multipole electrostatic deflectors", J. Vac. Sci. Technol. B, vol. 1 (4), 1983, pp. 1289-1292.

Office action in German patent application No. 10 2010 047 331.6 dated Jun. 14, 2011 (8 pages) (with English-language translation).

Extended European Search Report dated Nov. 2, 2012 from European patent application No. 11 007 981.1.

\* cited by examiner

ION BEAM SYSTEM AND METHOD OF OPERATING AN ION BEAM SYSTEM

CROSS-REFERENCES TO RELATED APPLICATIONS

The present application claims priority of patent application No. 10 2010 047 331.6, filed Oct. 1, 2010 in Germany, entitled "IONENSTRAHLGERÄT UND VERFAHREN ZUM BETREIBEN DESSELBEN", and of provisional patent application No. 61/404,433, filed Oct. 1, 2010 in the United States of America, entitled "ION BEAM APPARATUS AND METHOD FOR OPERATING THE SAME", the contents of which are hereby incorporated by reference in its entirety, and of U.S. patent application Ser. No. 13/251,174, filed Sep. 30, 2011, entitled "ION BEAM SYSTEM AND METHOD OF OPERATING ION BEAM SYSTEM, the content of which is hereby incorporated by reference in its entirety.

FIELD

The present invention relates to ion beam systems and methods of operating ion beam systems. In particular, the invention relates to ion beam systems and methods which generate an ion beam such that ions of the ion beam can be directed to selected different locations of the object, wherein kinetic energies of the ions incident on the object can be adjusted.

BACKGROUND

Ion beam systems are used, for example, to manufacture or modify structures of objects by removing material from the object or depositing material on the object using an ion beam. The removal of material from the object and the depositing of material on the object may involve supplying of a process gas to the object, wherein the process gas is activated using the ion beam.

Ion beam systems can be further used for generating an image of an object by scanning an ion beam across the object and detecting charged particles or other radiation emerging from the object due to the incidence of the ion beam. Intensities of the detected particles or radiation provide the image information similar to methods used for obtaining images of an object using a scanning electron microscope.

A conventional ion beam system comprises an ion beam source for generating an ion beam, an acceleration electrode for accelerating ions of the ion beam to an adjustable kinetic energy, and a beam deflector for directing the ion beam to a desired location on the object. The beam deflector comprises plural pairs of deflection electrodes distributed in a circumferential direction about the ion beam, wherein adjustable electric voltages can be applied to the pairs of deflection electrodes in order to generate an adjustable electric deflection field between the pairs of deflection electrodes resulting in the desired deflection of the ion beam.

It has been found that an accuracy of achieving a desired deflection of the beam can be insufficient, in particular if kinetic energies of the ions of the ion beam are low and/or if the desired amounts of deflection change rapidly.

SUMMARY

The present invention suggests ion beam systems and methods of operating ion beam systems taking the above considerations into account.

Embodiments of the invention provide an ion beam system having a beam deflector comprising a first deflection electrode and plural second deflection electrodes positioned opposite to the first deflection electrode and at different regions along the ion beam. The plural second deflection electrodes are electrically connected to a voltage supply system, wherein the voltage supply system is configured to supply different adjustable voltages to pairs of second deflection electrodes such that electric deflection fields generated between the first deflection electrode and each second deflection electrode of the pair of second electrodes have a same orientation and are, in particular, oriented in a same direction.

With such configuration it is possible to supply a given deflection voltage to all of the second deflection electrodes, to a subset of the second deflection electrodes and, in particular, to only one of the second deflection electrodes, or to supply different voltages to different second deflection electrodes. This offers many different possibilities to adjust a distribution along the ion beam of an electric deflection field generated by the beam deflector. If, for example, a same voltage is supplied to all of the second deflection electrodes, all second deflection electrodes generate an effective electric deflection field extending over substantially the whole length covered by the second deflection electrodes along the ion beam. If, for example, a voltage is supplied to only one of the second deflection electrodes, the effective deflection field is generated substantially only along the length covered by the one deflection electrode, such that the length of the deflection field extends over a substantially reduced length.

The length over which the effective electric deflection field extends along the ion beam can be determined, for example by determining a width of a distribution of the electric field intensity along the beam path. The width of the distribution of the electric deflection field along the beam path can be determined, for example, according to the following formula:

$$\sigma^2 = \frac{1}{N} \int (z-\mu)^2 \cdot E_\perp(z) \cdot dz, \quad (1)$$

wherein σ is the determined width, z is the position along the ion beam path, $E_\perp(z)$ is the intensity of the deflection field at position z, 1/N is a normalizing factor and μ is the mean value of the distribution of the electric deflection field. μ and N can be determined according to the following formulas:

$$\mu = \frac{1}{N} \int z \cdot E_\perp(z) \cdot dz \quad (2)$$

$$N = \int E_\perp(z) \cdot dz \quad (3)$$

According to some embodiments, the ion beam system has first and second modes of operation. A voltage supply system of the ion beam system supplies voltages to an acceleration electrode of the ion beam system such that a kinetic energy of ions of an ion beam used in the ion beam system is greater in the first of mode operation than it is in the second mode of operation. Further, the voltage supply system is configured such that a distribution of electric deflection fields along the ion beam path produced by a beam deflector has a greater width in the first mode of operation than in the second mode of operation. Ions traversing the beam deflector in the second mode of operation with a lower kinetic energy and, accordingly, at a lower speed experience a deflecting force along a shorter portion of the beam path than ions traversing the beam deflector in the first mode of operation at the higher kinetic energy and at higher speed. Compared to a mode of operation in which the distribution of the electric deflection fields along the ion beam path has a high width also at low kinetic energies, the shorter width of the electric deflection fields in the second mode of operation may have an advantage in that the ions having the lower kinetic energy experience the deflection force over a shorter period of time. It has been found that conventional deflectors having a given length such that a given maximum deflection voltage results in a desired deflection at a given maximum kinetic energy of the ions has a disadvantage in that a time duration required by ions of low kinetic energy to traverse the deflector is so long that rapid changes of the deflection voltage do not result in corresponding desired rapid deflections of the ion beam. The achievable deflection of an ion beam generated by a beam deflector is substantially proportional to a time average of the electric deflection fields experienced by the ions while traversing the deflector. The time required by the ion for traversing the deflector limits an accuracy of achieved deflections at rapid deflection changes, accordingly.

The embodiment illustrated above allows to adjust a width of the distribution along the ion beam path of the electric deflection fields by providing plural segmented second deflection electrodes and the corresponding voltage supply system. The adjustable width of the distribution along the ion beam path of the electric deflection fields allows to adjust the duration during which the ion experiences electric deflection fields while it traverses the beam deflector. With such configuration it is in particular possible, that the duration during which an ion of low kinetic energy experiences the deflection fields is not significantly greater than the duration during which an ion of a substantially higher kinetic energy experiences the deflection fields.

According to embodiments, the voltage supply system comprises at least one switch having a first switching state and a second switching state, wherein, in the first switching state, at least two second deflection electrodes are electrically connected to each other via the switch such that they are at a same common electric potential, and wherein, in the second switching state, the two second electrodes are not electrically connected to each other, such that they may have different electric potentials.

According to exemplary embodiments, the second deflection electrodes distributed along the ion beam path have different lengths, wherein the lengths of the second deflection electrodes may be continuously reducing along the beam path.

According to further exemplary embodiments, at least one of the first deflection electrodes can be positioned opposite to plural second deflection electrodes. According to further exemplary embodiments, one single first deflection electrode is positioned opposite to all second deflection electrodes, wherein a length of the first deflection electrode is substantially equal to a total length of all opposite second deflection electrodes.

According to other exemplary embodiments, the beam deflector comprises a same number of first deflection electrodes and second deflection electrodes, wherein one first deflection electrode is positioned opposite to each one of the second deflection electrodes.

According to some embodiments, the beam deflector comprises plural groups of second deflection electrodes distributed in a circumferential direction about the ion beam path. With such arrangement it is possible to deflect the ion beam into two independent directions. For example, two or four groups of second deflection electrodes can be provided, wherein one or more first deflection electrodes are positioned opposite to the second deflection electrodes of each group.

Embodiments of the invention provide a method of operating an ion beam system, wherein the method comprises: accelerating ions of an ion beam to a first kinetic energy and deflecting the ion beam into a first direction using an electric deflection field having a first field distribution along the ion beam; and subsequently, accelerating ions of the ion beam to a second kinetic energy and deflecting the ion beam into the first direction using the electric deflection field having a second field distribution along the ion beam; wherein the first kinetic energy is greater then the second kinetic energy; and wherein a width of the first field distribution is greater than a width of the second field distribution.

With such method it is possible to provide a deflection field having a narrow field distribution along the beam path for slow ions having a low kinetic energy in order to reduce a time required by the ions to traverse the deflection field, while a deflection field having a broader distribution is provided for faster ions having a higher kinetic energy, such that both low energy ions and high energy ions can be deflected with a relatively high accuracy.

According to exemplary embodiments, the accelerating of the ions of the ion beam to the first kinetic energy and the deflecting of the ion beam into the first direction further comprises deflecting the ion beam into a second direction opposite to the first direction using an electric deflection field having a third field distribution along the ion beam; wherein the accelerating of the ions of the ion beam to the second kinetic energy and the deflecting of the ion beam into the first direction further comprises deflecting the ion beam into the second direction using an electric deflection field having a fourth field distribution along the ion beam; and wherein a distance between a mean position along the ion beam path of the first field distribution and a mean position along the ion beam path of the third field distribution is greater than a distance between a mean position along the ion beam path of the second field distribution and a mean position along the ion beam path of the fourth field distribution.

With such arrangement it is possible to provide a double deflection, in which the ions are subsequently deflected in opposite directions. The mean positions of the distributions along the beam path of the opposite deflection fields have a greater distance along the beam path for the ions having the higher kinetic energy as compared to the ions having the lower kinetic energy. This is different from conventional double deflection systems in which mean values of the opposite deflection fields are provided at a distance from each other which is independent of the kinetic energy of the ions. Such conventional double deflectors generate deflections deviating from desired deflections due to traveling times required by low energy ions to traverse the opposite deflection fields. Such deviations can be avoided in the embodiment illustrated above, since the opposite deflection fields for low energy ions extend over a smaller length along the beam path than the opposite deflection fields provided for high energy ions.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

FIG. 4a is a graph illustrating a distribution of electric deflection fields along an ion beam path in the first mode of operation shown in FIG. 3a;

FIG. 4b is a graph illustrating a distribution of electric deflection fields along an ion beam path in the second mode of operation shown in FIG. 3a;

DETAILED DESCRIPTION OF EXEMPLARY EMBODIMENTS

Figure 1:
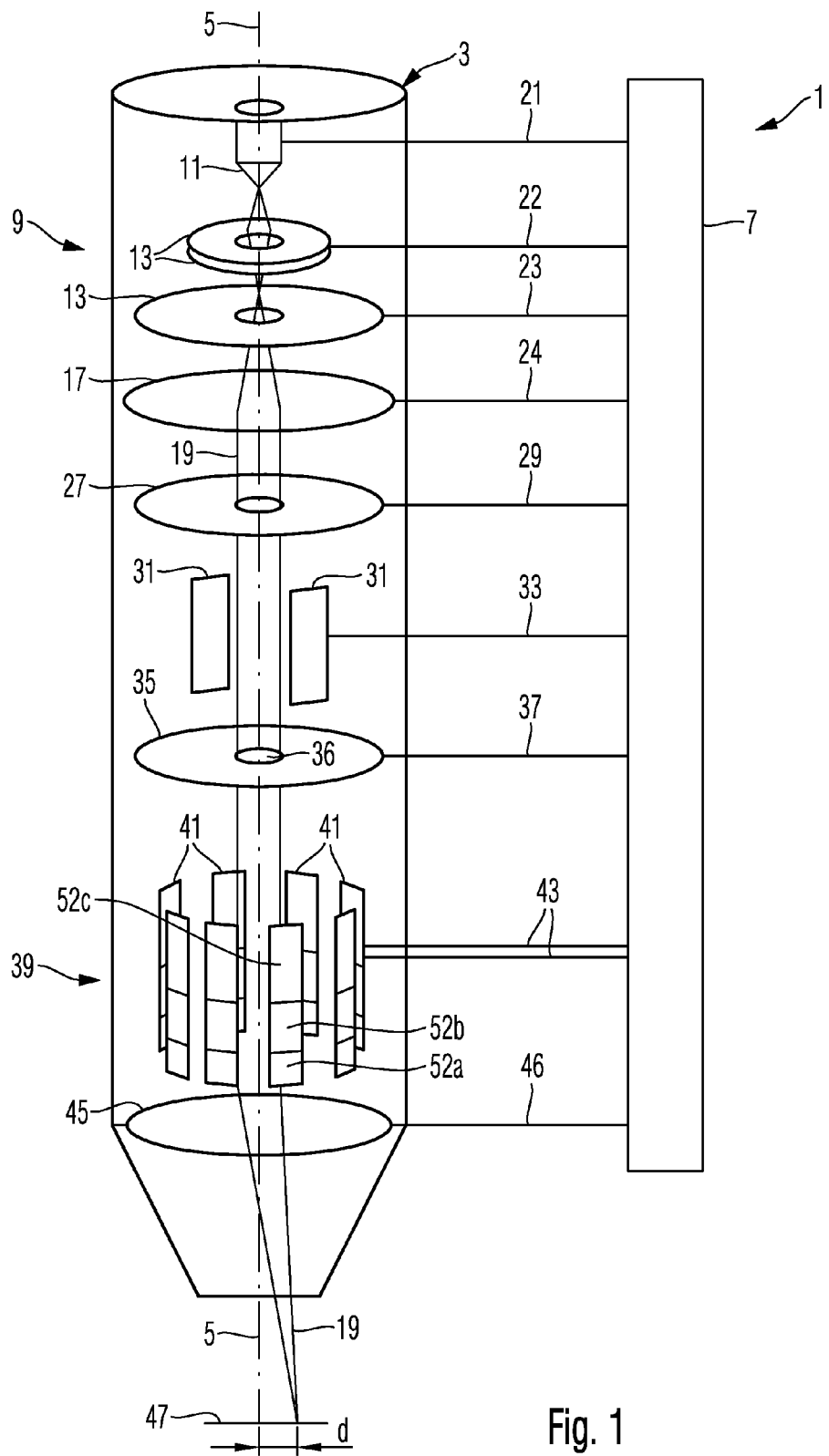
FIG. 1 is a schematic illustration of an ion beam system according to a first embodiment.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

An ion beam system 1 schematically illustrated in FIG. 1 comprises an ion beam column 3 including plural ion optical components distributed along an optical axis 5 of the ion beam column, and a controller 7 for controlling the ion optical components of the ion beam column 3.

The ion beam column 3 comprises an ion beam source 9 including an ion source 11, extraction and accelerating electrodes 13 for extracting and accelerating ions generated by the ion source 11, and an ion lens 17 for shaping a collimated ion beam 19 from the extracted and accelerated ions. Control voltages and control currents are supplied to the components 11, 13 and 17 via lines 21, 22, 23 and 24, respectively. An acceleration electrode 27 is positioned downstream of the lens 17 in the beam path of the ion beam 19. The acceleration electrode 13 comprises an aperture traversed by the ion beam 19, and an adjustable acceleration voltage is supplied from the controller 7 to the acceleration electrode 13 via a line 29 in order to accelerate the ions of the ion beam 19 to a desired kinetic energy. A pair of opposite deflection electrodes 31 are positioned downstream of the acceleration electrode 13 in the beam path of the ion beam. The controller 7 applies adjustable electric potentials to the deflection electrodes 31 via lines 33. An aperture plate 35 having an aperture 36 is positioned downstream of the pair of deflection electrodes 31, wherein the controller 7 can apply an adjustable electric potential to the aperture plate 35 via a line 37. The pair of deflection electrodes 31 and the aperture plate 35 provide a function of switching the ion beam on and off. If different electric potentials are applied to the deflection electrodes 31 via the lines 33, the ion beam 19 is deflected by the deflection electrodes 33 and may not traverse the aperture 36 of the aperture plate 35, while the beam may traverse the aperture 36 if same electric potentials are applied to the deflection electrodes 31.

A beam deflector 39 is positioned downstream of the aperture plate 35 in the beam path of the ion beam 19. The beam deflector 39 comprises plural groups 41 of deflection electrodes distributed around the beam in a circumferential direction. The controller 7 supplies adjustable deflection voltages to the deflection electrodes of the groups via lines 43 as illustrated in further detail below.

A focusing lens 45 is positioned in the beam path of the ion beam 19 downstream of the beam deflector 39 in order to focus the ion beam 19 in an object plane 47 of the lens 45. The deflection voltages supplied to the deflection electrodes via the lines 43 generate an electric deflection field within the beam deflector 39 in order to deflect the beam 19 away from the optical axis 5 such that it is incident on the object plane 47 at an adjustable distance d from the optical axis 5. A focusing power of the objective lens 45 is controlled by the controller 7 via a line 46.

The ion source 11 can be, for example, a source of Gallium $Ga^+$-ions such that the ion beam 19 is a beam of $Ga^+$-ions. The kinetic energy of the ions incident on the object plane 47 can be adjusted within a range from 1 keV to 30 keV, for example. A diameter of the focused ion beam 19 in the object plane can be within a range from 1 nm to 2 μm, for example. A maximum deflection d of the ion beam 19 away from the optical axis 5 can be within a range from 1 μm to 1000 μm, for example. Other exemplary ion sources comprise gas ion sources, plasma ion sources and gas-field ion sources allowing to produce a plurality of different ion beams differing with respect to ion type, beam energy and beam current.

Figure 2:
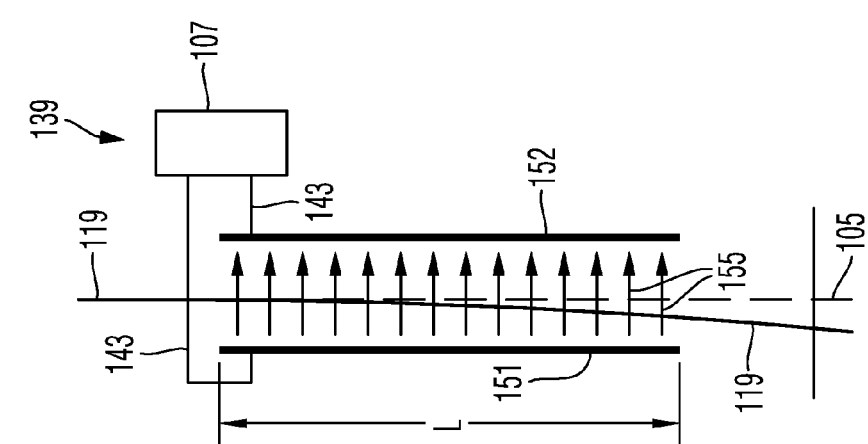
FIG. 2 is a schematic illustration of a conventional beam deflector.

FIG. 2 is a schematic illustration of a deflector 139 used in conventional ion beam systems for deflecting an ion beam 119. The deflector 139 comprises a first deflection electrode 151 and a second deflection electrode 152 located opposite to the first deflection electrode 151 with respect to an optical axis 105. A controller 107 can supply different electric potentials to the deflection electrodes 151 and 152 via lines 143, such that an electric deflection field represented by arrows 155 in FIG. 2 is generated between the deflection electrodes 151, 152, wherein the electric field 155 deflects the ion beam 119 away from the optical axis 105. A length L of the deflection electrodes 151, 152 along the optical axis 105 is selected such that a desired deflection of the ion beam 119 is achieved at a given maximum kinetic energy of the ions of the beam 119 of, for example, 30 keV, and a given maximum voltage difference between the deflection electrodes 151 and 152 of, for example, 300 V. The length L can be 20 mm, for example. At a relatively low kinetic energy of the ions of 1 keV, it takes about 385 ns for an ion to traverse the deflection electrodes 151, 152 and the corresponding electric deflection field 155 of the length L of 20 mm.

In an exemplary application, the ion beam is to be scanned across an object plane downstream of the deflector 139 such that a dwell time at each pixel of a scan line of 25 ns at a pixel frequency of 40 MHz. The slow ions of the low kinetic energy of 1 keV remain within the deflection field 155 for a time corresponding to a duration of 15 pixel positions. However, the deflection of the ions downstream of the deflection electrodes 151, 152 corresponds to a time average of the deflections caused by the deflections fields, wherein the deflection field has different intensities at different pixel positions. It is apparent that an accurate control of the deflection of the ions having the low kinetic energy is not possible with the deflection system 139.

Figure 3B:
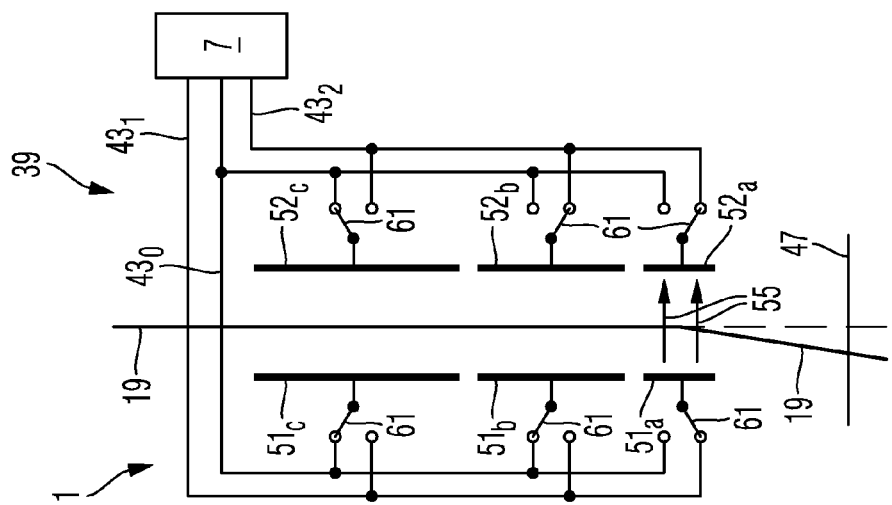
FIG. 3b is a schematic illustration of a beam deflector of the ion beam system shown in FIG. 1 in a second mode of operation.
Figure 3A:
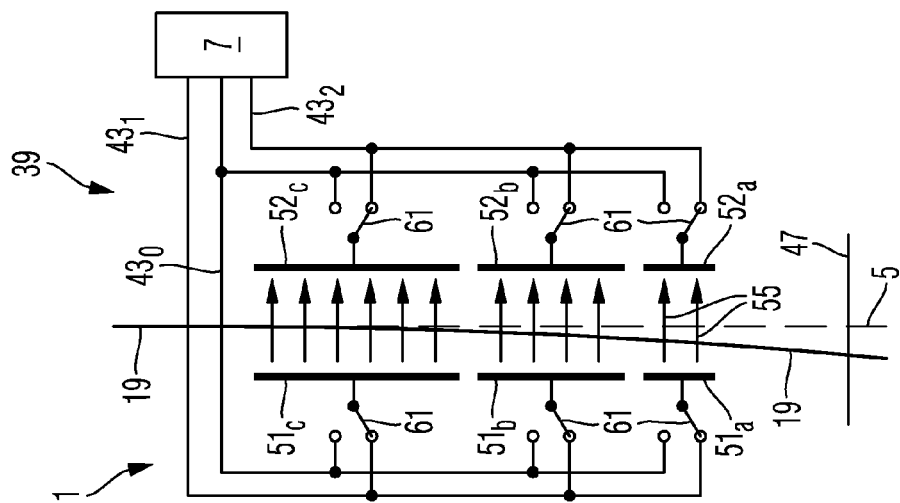
FIG. 3a is a schematic illustration of a beam deflector of the ion beam system shown in FIG. 1 in a first mode of operation.

FIG. 3a is a schematic illustration of a portion of the deflection electrodes of the beam deflector 39 of the ion beam system 1 shown in FIG. 1. The deflection electrodes of the beam deflector 39 differ from the deflection electrodes of the beam deflector 139 in FIG. 2 in that the electrodes are segmented rather than contiguous in the longitudinal direction of the beam. Plural first deflection electrodes 51a, 51b, 51c are positioned on one side of the optical axis 5, and plural second deflection electrodes 52a, 52b and 52c are positioned opposite to the first deflection electrodes 51a, 51b, 51c on the other side of the optical axis 5. A gap is provided between adjacent ones of the deflection electrodes 51a, 51b, 51c, such that different electric potentials can be applied to the deflection electrodes 51a, 51b and 51c. Similarly, gaps are provided between adjacent second deflection electrodes 52a, 52b and 52c, such that different electric potentials can also be applied to the second deflection electrodes 52a, 52b and 52c.

A voltage supply system for the deflection electrodes 51 and 52 comprises plural shutters 61 controlled by the controller 7 in order to selectively apply an electric potential to the electrodes supplied by the controller 7 via a line $43_0$, or to apply an electric potential to the first deflection electrodes supplied by the controller 7 via a line $43_1$. Similarly, the electric potential supplied by the controller 7 via the line $43_0$ or the electric potential supplied by the controller 7 via the line $43_2$ can be selectively supplied to the second deflection electrodes 52a, 52b and 52c.

FIG. 3a shows a first mode of operation of the ion beam system 1 in which the controller 7 applies an electric potential of 30 kV relative to a potential of the ion emitter to the acceleration electrode 13, such that the ions traversing the beam deflector 39 have a kinetic energy of 30 keV and require 71.4 ns for traversing the three pairs of deflection electrodes having a total length L of 20 mm. In this mode of operation, the switches 61 are set in a switching position such that all first deflection electrodes 51a, 51b and 51c are connected to the line $43_1$ and all second deflection electrodes 52a, 52b and 52c are connected to the line $43_2$, such that an electric deflection field is generated between all pairs of deflection electrodes 51 and 52 as indicated by arrows 55 in FIG. 3a.

A second mode of operation of the ion beam system 1 is shown in FIG. 3b. The electric potential applied to the acceleration electrode 13 in the second mode of operation is 1 keV relative to the electric potential of the ion emitter such that the kinetic energy of the ions traversing the beam deflector 39 amounts to 1 keV. These ions require 385 ns for traversing the deflection electrodes 51, 52 having the total length L of 20 mm. However, the switching positions of the switches 61 are set in the second mode of operation such that only the deflection electrode 51a is electrically connected to the line $43_1$, and only the deflection electrode 52a is electrically connected to the line $43_2$, while the remaining deflection electrodes 51b, 51c, 52b and 52c are connected to the line $43_0$. The controller 7 applies an electric potential to the line $43_0$ which corresponds to the potential or kinetic energy of the ions of the beam 19. This electric potential may, for example, correspond to an electric potential applied to a vacuum tube surrounding the beam, such that the ions of the beam 19 traverse the pairs 51c, 52c and 51b, 52b of deflection electrodes without experiencing a substantial deflection. The ions experience only the deflection generated by the electric deflection field 55 generated between the electrodes 51a and 52a. Due to the short length of the deflection electrodes 51a, 52a of, for example, 1 mm or 2 mm, which is significantly smaller than the length L of 20 mm of all deflection electrodes of the beam deflector 39, the ions stay within the deflection field 55 only for 20 ns which is significantly shorter than the dwell time of 25 ns of the beam at each individual pixel of the scan line.

The beam deflector 39 can achieve accurate deflections of ions having both low kinetic energies and high kinetic energies at high deflection frequencies.

In the conventional beam deflector shown in FIG. 2, high deflection voltages having an accuracy corresponding to the accuracy of the desired deflection have to be applied for deflecting ions having a high kinetic energy, while low deflection voltages of a same accuracy have to be applied for deflecting ions having a low kinetic energy. A dynamic range of the generated deflection voltages must be high, accordingly.

In the beam deflector 39 illustrated with reference to FIGS. 3a and 3b, deflection voltages applied to only the electrodes 51a and 52a in the mode of operation for low kinetic energy ions can be relatively high, such that a dynamic range of the generated deflection voltages can be significantly reduced relative to the conventional beam deflector. A relatively simple voltage supply providing a relatively low dynamic range can be used, accordingly.

Figure 4A:
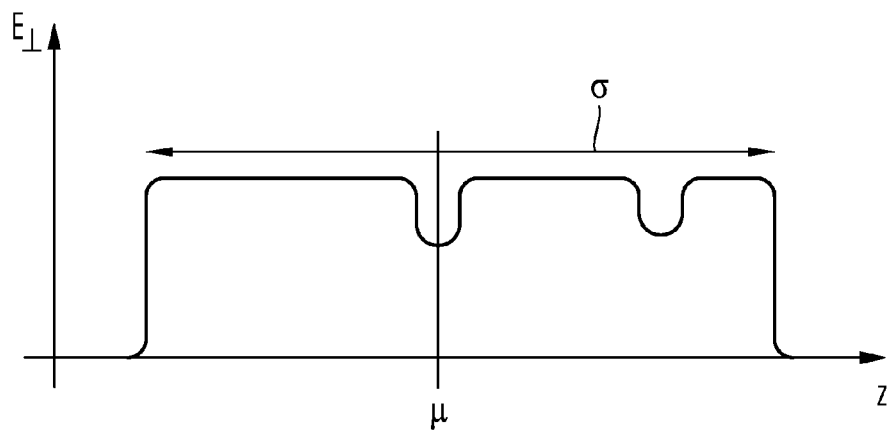

FIG. 4a shows a graph representing the electric field strength $E_\perp$ of the deflection fields depending on a position z along the optical axis 5 in the beam deflector 39 in the first mode of operation for high kinetic energy ions shown in FIG. 3a. FIG. 4a also indicates a mean position μ of the field distribution which can be determined according to formula (2) above, and a width σ of the distribution of the electric deflection fields in the deflector 39 which can be determined using the formula (1) indicated above.

Figure 4B:

Similarly, FIG. 4b shows a distribution of the electric deflection fields in the beam deflector 39 in the second mode of operation for low kinetic energy ions shown in FIG. 3b. FIG. 4b also indicates the mean position μ and the width σ of the field distribution which can also be calculated according to the above formulas (1) and (2). By comparing FIGS. 4a and 4b it is apparent that the width σ of the distribution of the electric deflection fields along the ion beam path is smaller in the second mode of operation for the low kinetic energy ions than in the first mode of operation for the high kinetic energy ions.

Figure 4C:
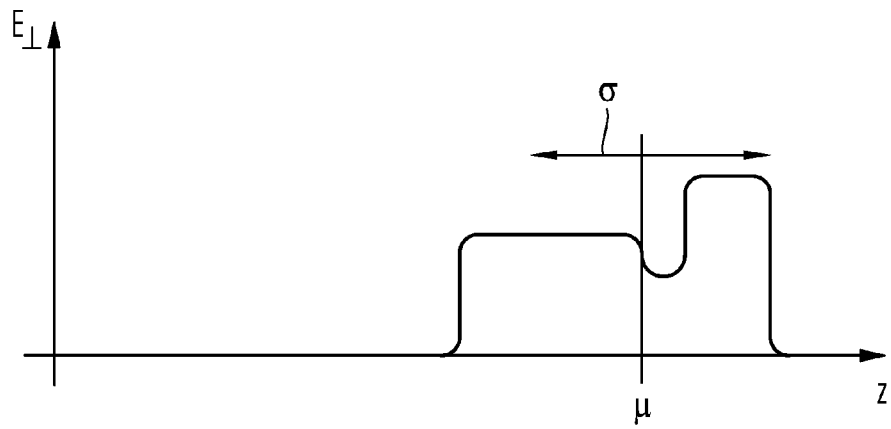
FIG. 4c is a graph illustrating a distribution of electric deflection fields along an ion beam path in a third mode of operation.

In the example illustrated with reference to FIGS. 3a and 3b, the non-deflecting electric potential supplied by the line $43_0$ or the deflection voltages supplied via the lines $43_1$ and $43_2$ can be selectively applied to the deflection electrodes 51 and 52, respectively. It is, however, also possible that each one of the deflection electrodes 51a, 51b and 51c and 52a, 52b and 52c, respectively, is connected via a separate line to the controller 7 such that individual adjustable voltages can be applied to the electrodes. This results in even more possibilities and combinations for adjusting the distribution of electric deflection fields along the ion beam path. One example of such configuration is shown in FIG. 4c. The deflection field generated by the central deflection electrodes 51b, 52b in this example has a lower intensity than the deflection field generated in the bottom pair of deflection electrodes 51a, 52a. Using such individual adjustment of the deflection voltages applied to the deflection electrodes, it is possible to achieve a substantially continuous adjustment of the width of the distribution of the electric deflection fields within the beam deflector.

Figure 5:
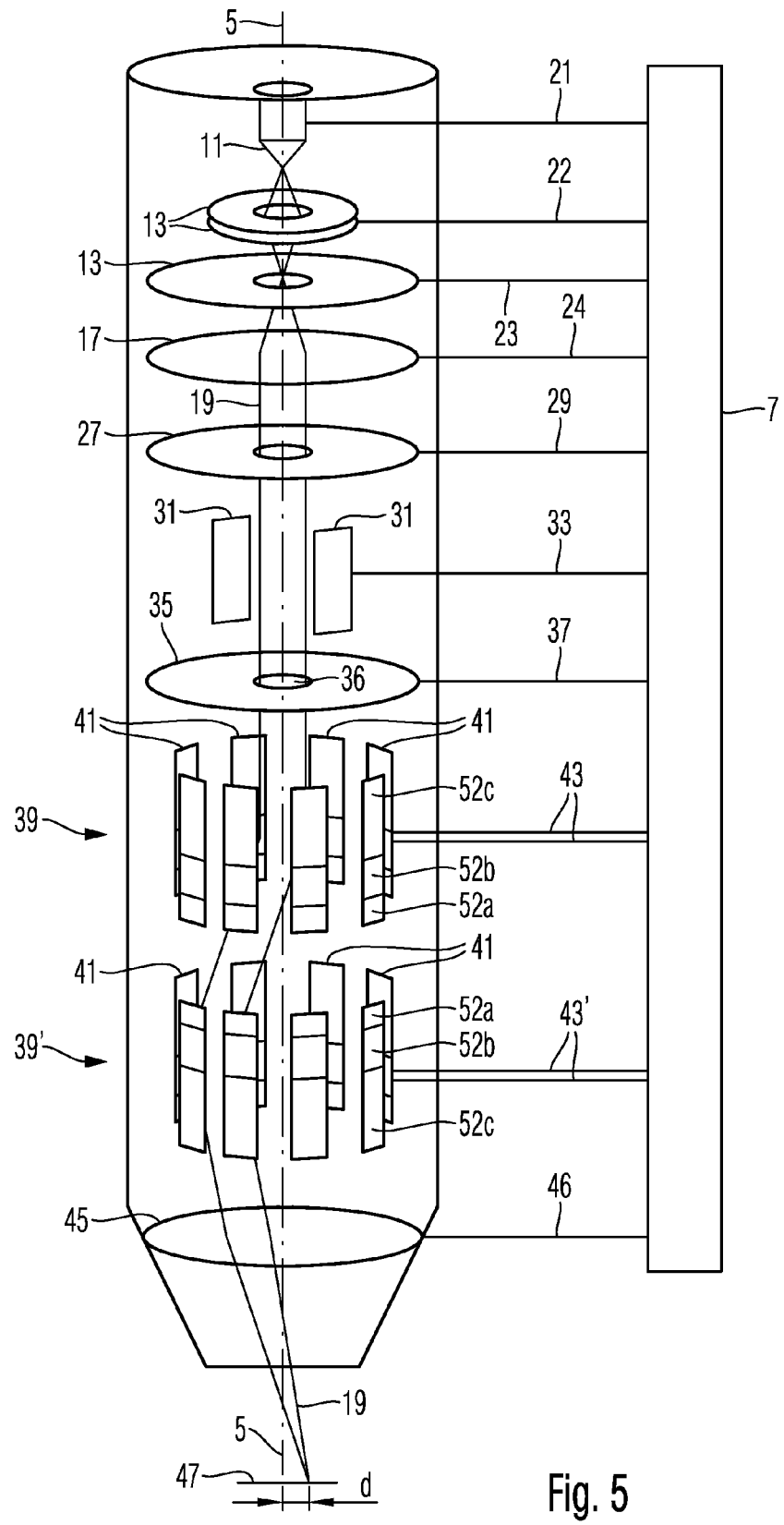
FIG. 5 is a schematic illustration of an ion beam system according to a second embodiment.

FIG. 5 shows a further embodiment of an ion beam system which has a configuration similar to the ion beam system shown in FIG. 1 and differs from the system shown in FIG. 1 mainly in that a second beam deflector 39' is positioned downstream of a beam deflector 39 in a beam path of an ion beam 19. The beam deflectors 39 and 39' are controlled by a controller 7 such that the ion beam is deflected away from an optical axis 5 by the first beam deflector 39 and deflected towards the optical axis by the second beam deflector 39' such that the beam 19 traverses an objective lens 45 near the optical axis 5 and is still focused at a distance d from the optical axis 5 in an object plane 47. Since the objective lens 45 is traverse closed to the optical axis for all deflections d in this embodiment, aberrations of the objective lens 45 do not significantly deteriorate the focusing of the ion beam 19 in the objective plane 47. A deflection system having two subsequent beam deflectors for deflecting the beam in opposite directions is also referred to as a double-deflector in this disclosure.

Further embodiments of beam deflectors which can be used in the ion beam systems illustrated with reference to FIGS. 1 and 5 above will be illustrated with reference to FIGS. 6 to 10 below. These embodiments are variations of the beam deflector illustrated with reference to FIGS. 3*a* and 3*b* with respect to number, arrangement, distance from the optical axis and orientation relative to the optical axis of deflection electrodes of the beam deflector.

Figure 6:
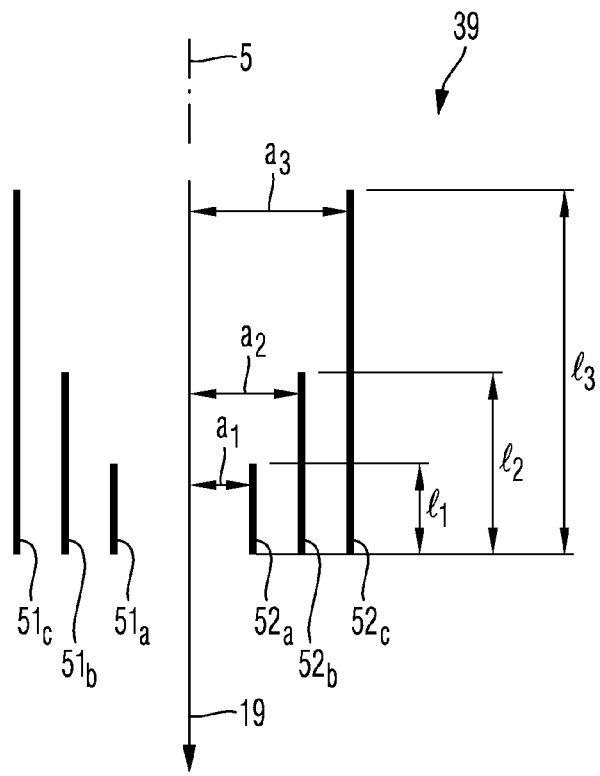
FIGS. 6 to 12 Are schematic illustrations of further embodiments of a beam deflector which can be used in ion beam systems as shown in FIGS. 1 and 5.
Figure 7:
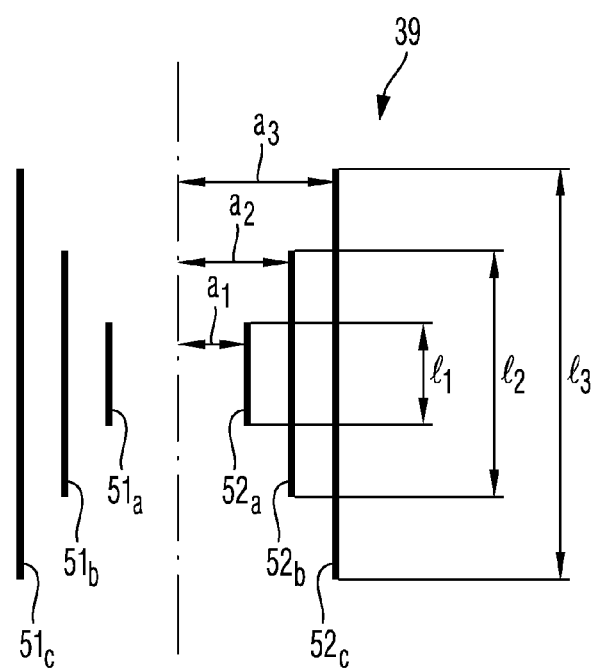
Figure 8:
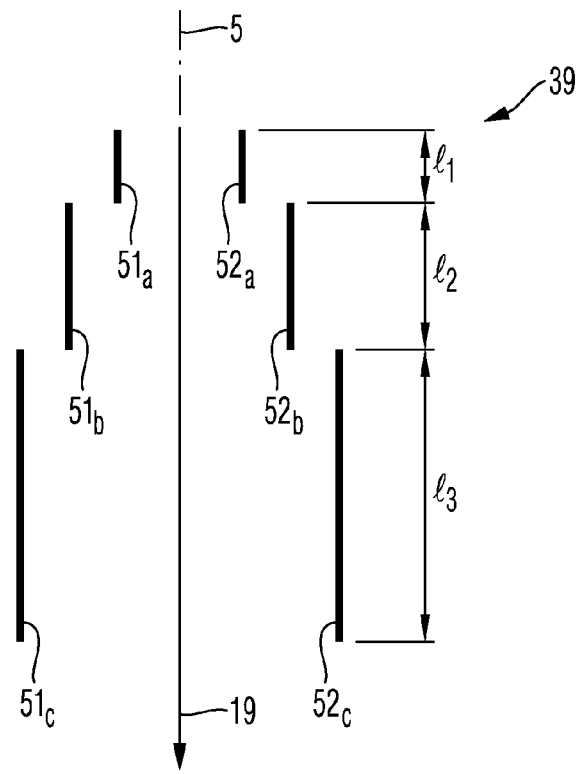
Figure 9:
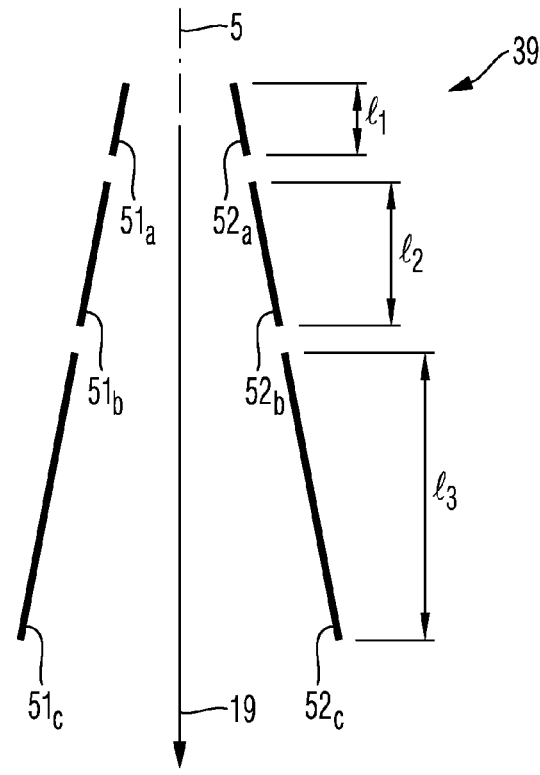

A beam deflector 39 shown in FIG. 6 comprises plural deflection electrodes 51*a*, 51*b*, 51*c* positioned on one side of an optical axis 5, and deflection electrodes 52*a*, 52*b*, 52*c* positioned opposite to the deflection electrodes 51*a*, 51*b*, 51*c* relative to the main axis 5. The deflection electrodes 52, 53, have different lengths $l_1$, $l_2$, $l_3$ along the main axis 5 and are positioned at different distances $a_1$, $a_2$ and $a_3$, respectively, from the main axis 5. In particular, the shorter deflection electrodes 51*a* and 52*a* having the length $l_1$ are positioned within the relatively longer deflection electrodes 51*b* and 52*b* having the length $l_2$, wherein the deflection electrodes 51*b* and 52*b* are again positioned within the even longer deflection electrodes 51*c* and 52*c* having the length $l_3$. The deflection electrodes overlap when seen in a direction orthogonal to the ion beam 19 but cover different regions along the beam. Assuming an orientation of the ion beam 19 represented by the arrow 19 in FIG. 6, all deflection electrodes overlap at an exit end of the longest deflection electrodes 51*c*, 52*c*. If the direction of the beam is reversed, it is, however, also possible that all electrodes overlap at an entrance end of the longest electrodes 51*c*, 52*c*. Many other variations of the arrangement of the deflection electrodes along the beam direction are possible. FIGS. 7 and 8 show further examples, wherein FIG. 7 shows a configuration which is symmetric when seen in the beam direction, while FIG. 8 shows a configuration where the deflection electrodes do not overlap and are positioned at a distance from the main axis 5 which increases in the beam direction 19. A configuration in which distances of the electrodes from the main axis 5 increase in the beam direction is also shown in FIG. 9, wherein, in this example, the deflection electrodes are not oriented parallel to the main axis 5 as this was the case in the examples illustrated with reference to FIGS. 3, 6, 7 and 8 above. In the example shown in FIG. 9, the deflection electrodes have a conical shape and are oriented at an angle relative to the main axis 5. It is also possible to reverse the beam direction in the embodiments shown in FIGS. 8 and 9, such that the electrodes are positioned at a distance from the main axis which reduces in beam direction.

Figure 10:
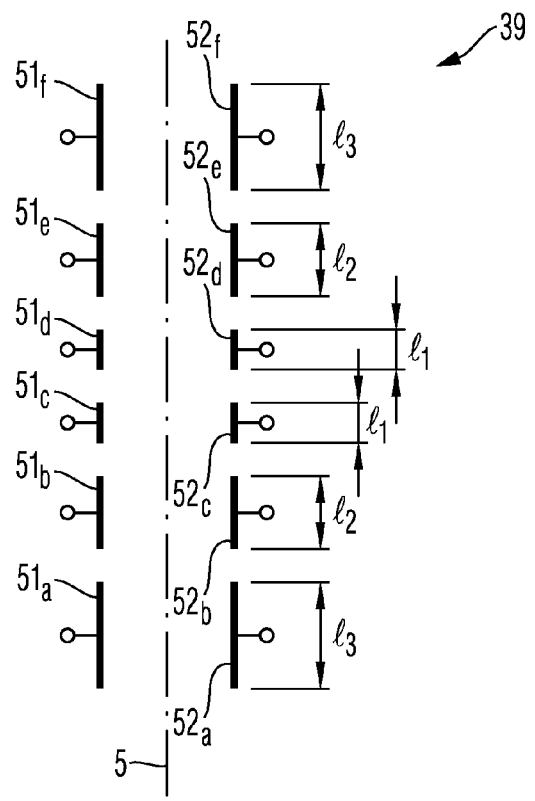

FIG. 10 shows an embodiment of a beam deflector 39 having more than three first deflection electrodes 51 and more than three second deflection electrodes 52. The first and second deflection electrodes 51*a* to 51*f* and 52*a* to 52*f* have three different lengths $l_1$, $l_2$ and $l_3$ in beam direction, and a configuration of the deflection electrodes is symmetric in the beam direction, such that the shorter deflection electrodes 51*c*, 51*d*, 52*c*, 52*d* having the length $l_1$ are positioned in the center of the beam deflector 39, wherein deflection electrodes of increasing lengths are positioned at increasing distances from the center.

The first deflection electrodes 51*a* to 51*f* are positioned along a straight line, wherein a gap is provided between each pair of adjacent electrodes. It is, however, also possible to provide no gap between two or more of the plural first electrodes 51*a* to 51*f* such that the two or more electrodes provide common contiguous first deflection electrodes. It is in particular possible that all of the plural first deflection electrodes 51*a* to 51*f* are embodied as one single contiguous electrode positioned opposite to the plural second deflection electrode 52*a* to 52*f*. With such contiguous single first deflection electrode it is still possible to generate electric deflation fields of different widths since the second deflection electrodes 2*a* to 2*f* are segmented in the beam direction and can be supplied with different deflection voltages.

The beam deflector 39 shown in FIG. 10 can also be used to provide two beam deflectors or a double-deflector as illustrated with reference to FIG. 5. For example, the deflection electrodes 51*d*, 51*e*, 51*f* and 52*d*, 52*e*, 52*f* can provide a first, upstream deflector, and the deflection electrodes 51*a*, 51*b*, 51*c* and 52*a*, 52*b*, 52*c* can provide a second, downstream deflector. The principles illustrated above can be also used to supply deflection voltages to the deflection electrodes for first and second modes of operation involving high and low energy ions, respectively. For example, deflection voltages can be applied to all deflection electrodes in the first mode of operation for high kinetic energy ions of 30 keV, for example, and deflection voltages can be applied only to the central short deflection electrodes 51*c*, 52*c* and 51*d*, 52*d* in the second mode of operation for ions having kinetic energies of 1 keV, for example.

Figure 11:
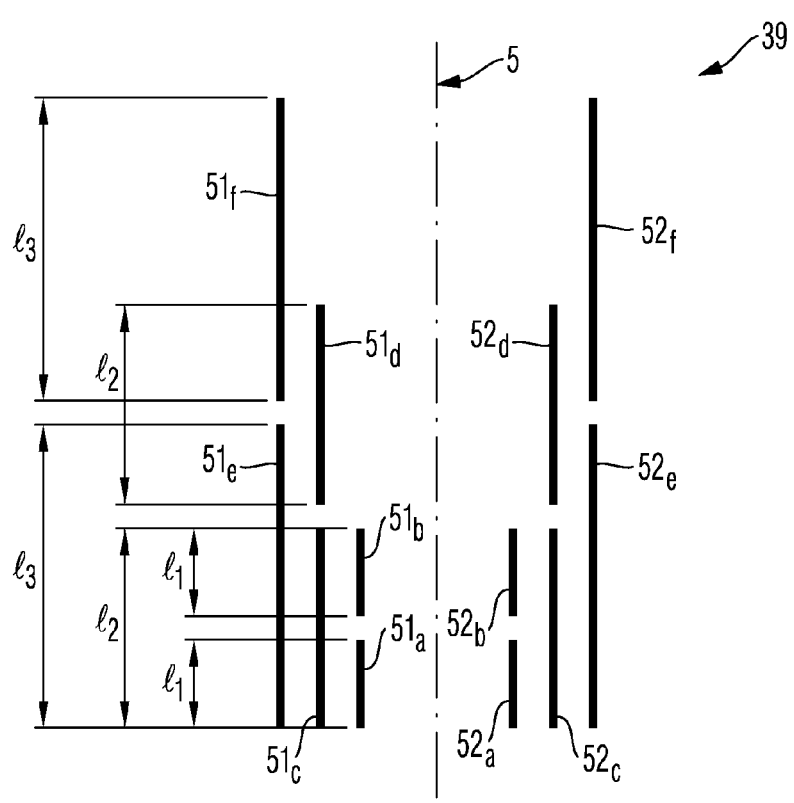

A further embodiment of a double-deflection system is shown in FIG. 11, wherein a configuration of deflection electrodes is similar to the embodiment of FIG. 6. Two deflectors are provided along the beam path as illustrated with reference to FIG. 5. Voltages are supplied to the deflection electrodes such that the beam is first deflected away from the main axis 5 and then deflected back towards the main axis such that the beam traverses an objective lens (not shown in FIG. 11), close to the optical axis.

In the first mode of operation for the high kinetic energy ions, the long deflection electrodes 51*f*, 52*f*, 51*e* and 52*e* having a length $l_3$ are supplied with opposite deflection voltages, while in the second mode of operation for the low kinetic energy ions, only the short deflection electrodes 51*b*, 52*b* and 51*a*, 52*a* having a length $l_1$ are supplied with opposite deflection voltages. In a third mode of operation for ions having a medium kinetic energy of, for example 10 keV, the middle deflection electrodes 51*d*, 52*d* and 51*c*, 52*c* having a length $l_2$ are supplied with opposite deflection voltages.

The electrodes of the beam deflector shown in FIG. 11 have an overlapping configuration such that inner electrodes positioned at a smaller distance from the main axis 5 may screen outer electrodes positioned at a greater distance from the axis 5, wherein the outer electrodes may still generate effective deflection fields.

Figure 12C:
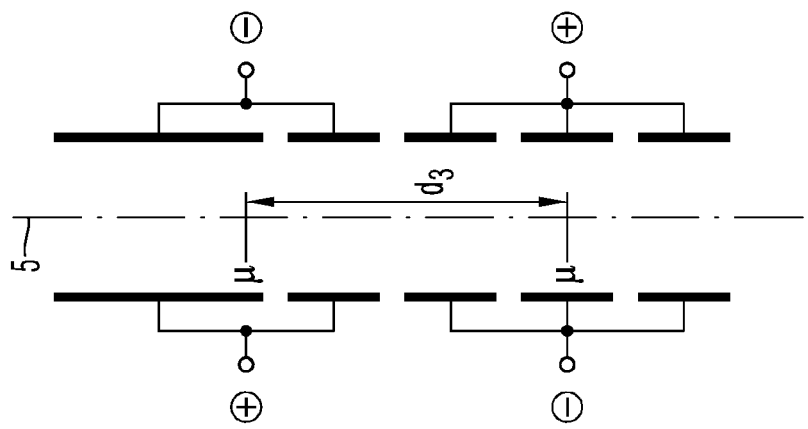
Figure 12B:
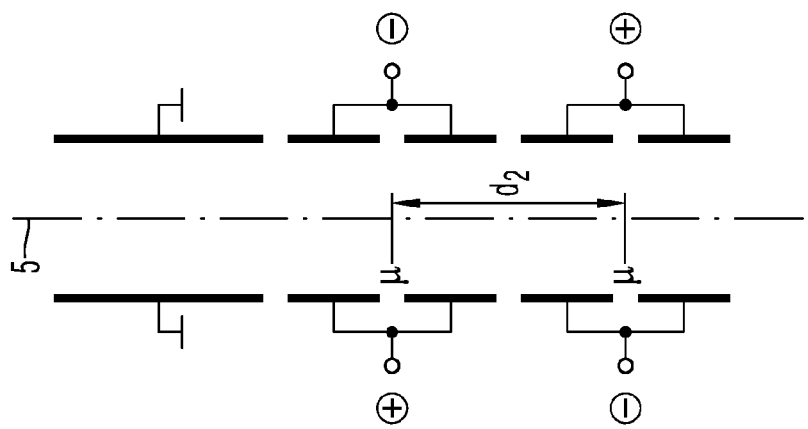
Figure 12A:
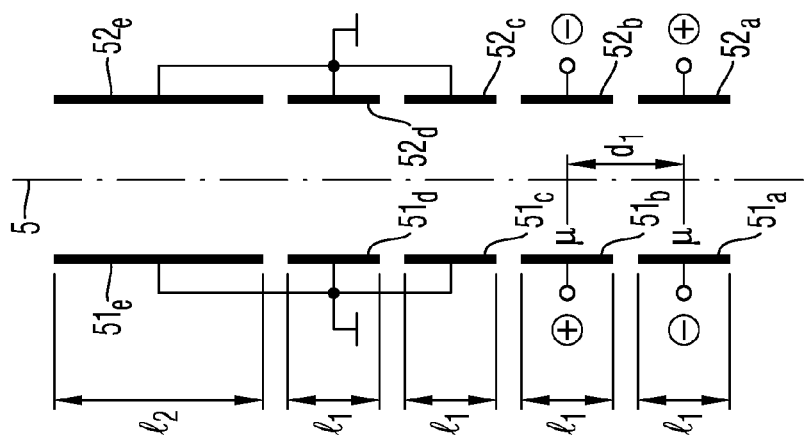

FIGS. 12*a*, 12*b* and 12*c* show three different modes of operation of a further embodiment of an arrangement of deflection electrodes which can be operated as a double-deflector. The arrangement comprises five first deflection electrodes 51*a*, 51*b*, 51*c*, 51*d* and 51*e* arranged along a straight line parallel to a main axis 5 and five second deflection electrodes 52*a*, 52*b*, 52*c*, 52*d* and 52*e* also arranged along a straight line parallel to the main axis 5. FIG. 12*a* illustrates a first mode of operation used for ions having a low kinetic energy of 1 keV, for example. The lower deflection electrodes 51*b*, 52*b* and 51*a*, 52*a* having a short length $l_1$ are operated as a double-deflector by applying opposite electric voltages to adjacent pairs of electrodes and opposite pair of electrodes as indicated by symbols "+" and "−" in FIG. 12a. The upper deflection electrodes 51c, 51d, 51e and 52c, 52d, 52e are electrically connected to each other and supplied with an electric potential such that they do not affect the ion beam.

FIG. 12b illustrates a second mode of operation used for ions having a medium kinetic energy of 10 keV, for example. The lower adjacent first electrodes 51a and 51b are electrically connected with each other, and the lower second deflection electrodes 52a and 52b are electrically connected with each other to form a downstream deflector, while the first deflection electrodes 51c and 51d are connected with each other and the second deflection electrodes 52c and 52d are connected with each other to form the upstream deflector of the double-deflector. Again, applied deflection voltages are represented by the symbols "+" and "−", and voltages which do not affect the ion beam are supplied to the deflection electrodes 51e and 52e.

FIG. 12c illustrates a third mode of operation used for ions having a high kinetic energy of 30 keV, for example. In this mode of operation, the first deflection electrodes 51a, 51b and 51c are connected with each other and supplied with a same voltage indicated by the symbol "−", and the second deflection electrodes 52a, 52b and 52c are connected with each other and supplied with a voltage indicated by the symbol "+" in order to form a downstream deflector. The first deflection electrodes 51d and 51e are connected with each other and supplied with the voltage "+" and the second deflection electrodes 52d and 52e are connected with each other and supplied with the deflection voltage "−" in order to form the upstream deflector.

Central or mean positions μ of the generated opposite deflection fields are shown in FIGS. 12a, 12b and 12c. The mean positions μ have a small distance d1 in the first mode of operation for the ions having the low kinetic energy, a medium distance d2 in the second mode of operation for the ions having the medium kinetic energy, and a greater distance d3 in the third mode of operation for the ions having the high kinetic energy. This has an advantage in that traveling times of the ions traversing the deflection fields are sufficiently low for all kinetic energies such that the subsequent deflections in opposite directions produce a desired deflection also when the deflection voltages change rapidly. This avoids to apply other measures of reducing deviations from desired deflections which may include, for example, delaying of signals applied to the downstream deflector relative to signals applied to the upstream deflector.

The symbols "+" and "−" used in FIGS. 12a, 12b and 12c are intended to illustrate the relation of voltages applied to opposite electrodes in order to deflect the ion beam in the one or the other direction. This does not require, however, that all voltages represented by the symbol "+" are equal to each other or that all voltages represented by the symbol "−" are equal to each other. For example, the voltage applied to the electrode 52a in FIG. 12a can be different from the voltage applied to the electrode 51b in FIG. 12a.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A method of operating an ion beam system, wherein the method comprises:
   accelerating ions of an ion beam to a first kinetic energy and deflecting the ion beam into a first direction using an electric deflection field having a first field distribution along the ion beam; and, subsequently,
   accelerating ions of the ion beam to a second kinetic energy and deflecting the ion beam into the first direction using the electric deflection field having a second field distribution along the ion beam;
   wherein the first kinetic energy is greater than the second kinetic energy; and
   wherein a width of the first field distribution is greater than a width of the second field distribution.

2. The method according to claim 1, wherein the accelerating of the ions of the ion beam to the first kinetic energy and the deflecting of the ion beam into the first direction further comprises deflecting the ion beam into a second direction opposite to the first direction using an electric deflection field having a third field distribution along the ion beam;
   wherein the accelerating of the ions of the ion beam to the second kinetic energy and the deflecting of the ion beam into the first direction further comprises deflecting the ion beam into the second direction using an electric deflection field having a fourth field distribution along the ion beam;
   wherein a mean position along the ion beam of the third field distribution is located downstream of a mean position along the ion beam of the first field distribution;
   wherein a mean position along the ion beam of the fourth field distribution is located downstream of a mean position along the ion beam of the second field distribution.

3. The method according to claim 2, wherein a distance between the mean position along the ion beam of the first field distribution and the mean position along the ion beam of the third field distribution is greater than a distance between the mean position along the ion beam of the second field distribution and the mean position along the ion beam of the fourth field distribution.

4. The method according to claim 3, further comprising focusing the ion beam using a focusing lens located downstream of the electric deflection field.

5. The method according to claim 2, wherein the mean position along the ion beam of the fourth field distribution is located downstream of the mean position along the ion beam of the third field distribution.

6. The method according to claim 5, further comprising focusing the ion beam using a focusing lens located downstream of the electric deflection field.

7. The method according to claim 2, wherein the mean position along the ion beam of the second field distribution is located downstream of the mean position along the ion beam of the first field distribution.

8. The method according to claim 7, further comprising focusing the ion beam using a focusing lens located downstream of the electric deflection field.

9. The method according to claim 2, further comprising
   accelerating ions of the ion beam to a third kinetic energy,
   deflecting the ion beam into the first direction using the electric deflection field having a fifth field distribution along the ion beam, and
   deflecting the ion beam into the second direction using the electric deflection field having a sixth field distribution along the ion beam;
   wherein the second kinetic energy is greater than the third kinetic energy;

wherein the width of the second field distribution is greater than a width of the fifth field distribution;

wherein the width of the fourth field distribution is greater than a width of the sixth field distribution; and wherein a mean position along the ion beam of the sixth field distribution is located downstream of a mean position along the ion beam of the fifth field distribution.

10. The method according to claim 9, further comprising focusing the ion beam using a focusing lens located downstream of the electric deflection field.

11. The method according to claim 9, wherein a distance between the mean position along the ion beam of the second field distribution and the mean position along the ion beam of the fourth field distribution is greater than a distance between the mean position along the ion beam of the fifth field distribution and the mean position along the ion beam of the sixth field distribution.

12. The method according to claim 11, further comprising focusing the ion beam using a focusing lens located downstream of the electric deflection field.

13. The method according to claim 9, wherein the mean position along the ion beam of the fifth field distribution is located downstream of the mean position along the ion beam of the second field distribution.

14. The method according to claim 13, further comprising focusing the ion beam using a focusing lens located downstream of the electric deflection field.

15. The method according to claim 9, wherein the mean position along the ion beam of the sixth field distribution is located downstream of the mean position along the ion beam of the fourth field distribution.

16. The method according to claim 15, further comprising focusing the ion beam using a focusing lens located downstream of the electric deflection field.

* * * * *

UNITED STATES PATENT AND TRADEMARK OFFICE
CERTIFICATE OF CORRECTION

PATENT NO. : 8,921,805 B2  
APPLICATION NO. : 14/218563  
DATED : December 30, 2014  
INVENTOR(S) : Josef Biberger et al.

Page 1 of 1

It is certified that error appears in the above-identified patent and that said Letters Patent is hereby corrected as shown below:

Title page,

"Related U.S. Application Data

(63) Continuation-in-part of application No. 13/251,174,

Filed on Sep. 30, 2011, now Pat. No 8,710,451."

should read

--Related U.S. Application Data

(63) Division of application No. 13/251,174,

Filed on Sep. 30, 2011, now Pat. No 8,710,451.--

Signed and Sealed this  
Twenty-eighth Day of April, 2015

Michelle K. Lee  
*Director of the United States Patent and Trademark Office*